(12) United States Patent  
Menon et al.

(10) Patent No.: US 8,143,601 B2
(45) Date of Patent: Mar. 27, 2012

(54) NANOSCALE IMAGING VIA ABSORPTION MODULATION

(75) Inventors: Rajesh Menon, Cambridge, MA (US); Henry I. Smith, Sudbury, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 772 days.

(21) Appl. No.: 12/186,968

(22) Filed: Aug. 6, 2008

(65) Prior Publication Data

US 2009/0046299 A1    Feb. 19, 2009

Related U.S. Application Data

(60) Provisional application No. 60/955,711, filed on Aug. 14, 2007.

(51) Int. Cl.
*G01J 1/58* (2006.01)
(52) U.S. Cl. .............. 250/486.1; 250/216; 250/309; 250/310; 250/311; 359/586; 359/587
(58) Field of Classification Search .......... 250/216, 250/486.1, 234, 309–311; 359/586–587
See application file for complete search history.

(56) References Cited

U.S. PATENT DOCUMENTS

| 2003/0011722 | A1* | 1/2003 | Kasama et al. .............. 349/43 |
| 2005/0013536 | A1* | 1/2005 | Walt ........................... 385/27 |
| 2005/0025032 | A1* | 2/2005 | Oumi et al. ................ 369/118 |
| 2005/0078411 | A1* | 4/2005 | Song et al. ................. 360/126 |
| 2006/0061754 | A1* | 3/2006 | Turner et al. ................ 356/38 |
| 2009/0146081 | A1* | 6/2009 | Stark ....................... 250/492.2 |
| 2009/0201475 | A1* | 8/2009 | Peckerar et al. ............. 355/53 |

FOREIGN PATENT DOCUMENTS

| WO | 0210830 | 2/2002 |
| WO | 2006088643 | 8/2006 |

OTHER PUBLICATIONS

Menon et al., "Far-field generation of localized light fields using absorbance modulation" Physical Review Letters APS USA, vol. 98, No. 4, Jan. 26, 2007, pp. 043905-1-043905-4.
Kataja et al., "Super resolution near field structure study" Optical Memory and Optical Data Storage Topical Meeting, 2002. international Symposium on 7-11, pp. 135-137.

* cited by examiner

*Primary Examiner* — Georgia Y Epps
*Assistant Examiner* — Kevin Wyatt
(74) *Attorney, Agent, or Firm* — Gesmer Updegrove LLP

(57) ABSTRACT

An imaging system is provided. The imaging system includes a sample to be scanned by the imaging system. An absorbance modulation layer (AML) is positioned in close proximity to the sample and is physically separate from the sample. One or more sub-wavelength apertures are generated within the AML, whose size is determined by the material properties of the AML and the intensities of the illuminating wavelengths. A light source transmits an optical signal through the one or more sub-wavelength apertures generating optical near-fields that are collected for imaging.

24 Claims, 10 Drawing Sheets

NANOSCALE IMAGING VIA ABSORPTION MODULATION

PRIORITY INFORMATION

This application claims priority from provisional application Ser. No. 60/955,711 filed Aug. 14, 2007, which is incorporated herein by reference in its entirety.

BACKGROUND OF THE INVENTION

The invention is related to the field scanning microscopy, in particular a novel technique for high resolution scanning optical microscopy that uses an absorbance-modulation layer on top of a sample or substrate to generate optical near-fields from the far-field.

The conventional technique in this field is near-field scanning microscopy. In this technique a physical probe is brought into close proximity of a sample. The optical near-field that emanates from the probe interacts with the sample. Detection of scattered light followed by signal processing reveals information at high resolution, for example, beyond the far-field diffraction limit. There are many problems associated with using the conventional technique. One problem is the close proximity of a probe and a sample increases the likelihood of damaging the sample. Since the signal is very sensitive to the gap between the probe and the sample, a complex feedback-based control system is required to maintain this constant gap. Most importantly, this technique is very slow because it is a serial process. It is extremely difficult to parallelize this technique using multiple probes due to the difficulties associated with maintaining the nanoscale gap for each probe accurately.

More recently, an alternative technique that utilizes reversible saturable transitions was proposed. In this technique, first, an excitation (for example of fluorescence) is carried out by a focused laser beam. Then, the excitation is quenched by a second laser beam that is focused to a ring-shaped spot. The excitation is quenched everywhere except at a small region near the center of this ring-shaped spot. The signal from this small region is then collected. By scanning the sample with respect to the optics, an image is built up. However, the material (or molecule) that undergoes reversible saturable transitions is intimately associated (for example, chemically) with the sample. Also, the excitation is diffraction limited (and hence, large), while the signal is localized via quenching. This limits the type of signals that may be studied.

SUMMARY OF THE INVENTION

According to one aspect of the invention, there is provided an imaging system. The imaging system includes a sample to be scanned by the imaging system. An absorbance modulation layer (AML) is positioned in close proximity to the sample and is physically separate from the sample. One or more sub-wavelength apertures are generated within the AML, whose size is determined by the material properties of the AML and the intensities of the illuminating wavelengths. A light source transmits an optical signal through the one or more sub-wavelength apertures generating optical near-fields that are collected for imaging.

According to another aspect of the invention, there is provided there is provided a method of forming an imaging system. The method includes providing a sample to be scanned by the imaging system. An absorbance modulation layer (AML) is formed and positioned in close proximity to the sample and is physically separate from the sample. Also, the method includes forming one or more sub-wavelength apertures within the AML, whose size is determined by the material properties of the AML and the intensities of the illuminating wavelengths. Moreover, the method include providing a light source transmits an optical signal through the one or more sub-wavelength apertures generating optical near-fields that are collected for imaging.

According to another aspect of the invention, there is provided a method of performing the operations of an imaging system. The method includes scanning a sample by the imaging system. An absorbaance modulation layer (AML) is positioned in close proximity to the sample and is physically separate from the sample. Also, the method includes generating one or more sub-wavelength apertures within the AML, whose size is determined by the material properties of the AML and the intensities of the illuminating wavelengths. Moreover, the method includes transmitting an optical signal through the one or more sub-wavelength apertures generating optical near-fields that are collected for imaging.

DETAILED DESCRIPTION OF THE INVENTION

The invention proposes a novel technique for high resolution scanning optical microscopy that uses an absorbance-modulation layer on top of a sample or substrate to generate optical near-fields from the far-field. This technique allows one to achieve the high resolution provided by the near field, while maintaining a large working distance between the last optic and the substrate, which will enable easy scanning and parallelization.

Figure 1:
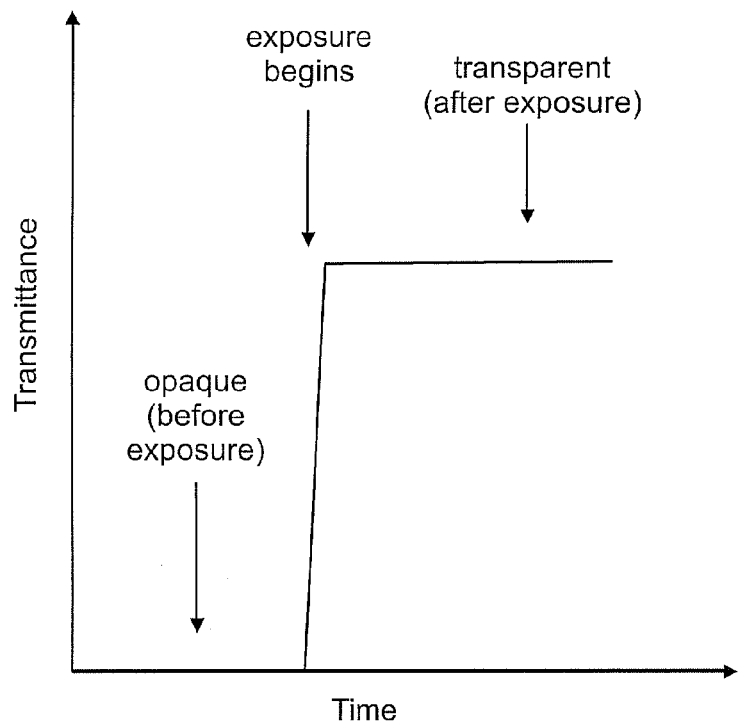
FIG. 1 is a graph illustrating the change in absorbance of an ideal photobleachable material upon illumination.

Polymers, whose absorbance can be changed, have been proposed in the past, for example to improve the resolution in photolithography. A thin layer is spin-coated on top of the photoresist. The absorbance of this layer decreases with increasing exposure dose, i.e., the layer becomes more transparent with exposure. The intensity of transmitted light is plotted as a function of time in FIG. 1 for such a material. Before illumination, the material is opaque and almost no light is transmitted. After sufficient illumination, the material becomes transparent and light is transmitted.

By illuminating this layer with a tightly focused beam, a small transparent region in the layer can be created. This transparent region will serve as a sub-diffraction aperture allowing only the evanescent fields to push through to the other side. The size of this aperture can be controlled by the intensity of the illumination and the material parameters of the layer.

Figure 2:
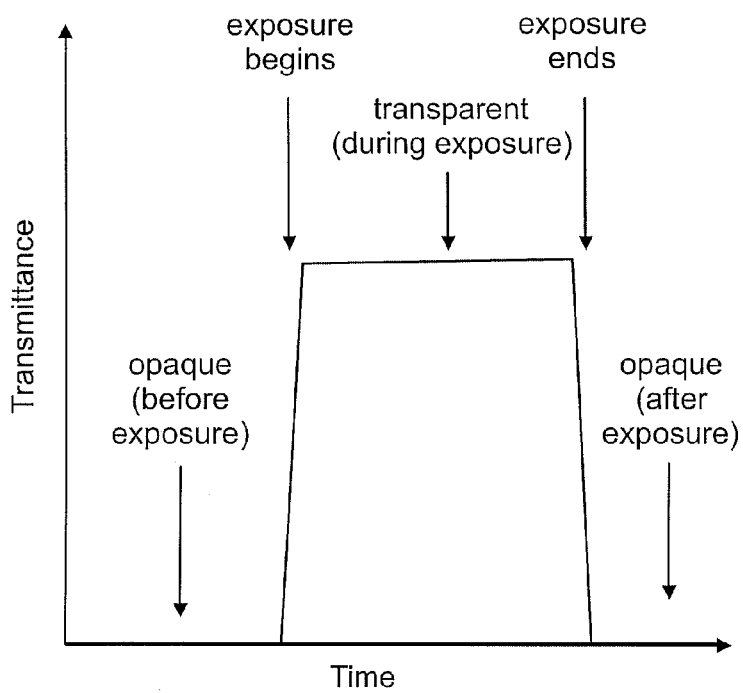
FIG. 2 is a graph illustrating the transmittance characteristics of an ideal absorbance modulation material.

If the change in absorbance process is reversible (either spontaneously or via another exposure), then when the illumination is turned off, the aperture becomes opaque and no light is transmitted. The focused spot can now be scanned to an adjacent region on the layer and a new aperture of the same size but shifted laterally can be opened. Since the aperture is sub-diffraction limited, the two apertures may be placed closer together than would otherwise be possible due to diffraction. The transmittance of such an ideal absorbance-modulation material is plotted as a function of time in FIG. 2. Note that the material is opaque to the exposing wavelength before illumination. After illumination, the material becomes transparent. But once the illumination is turned off, the material recovers its original opaque state.

Figure 3:
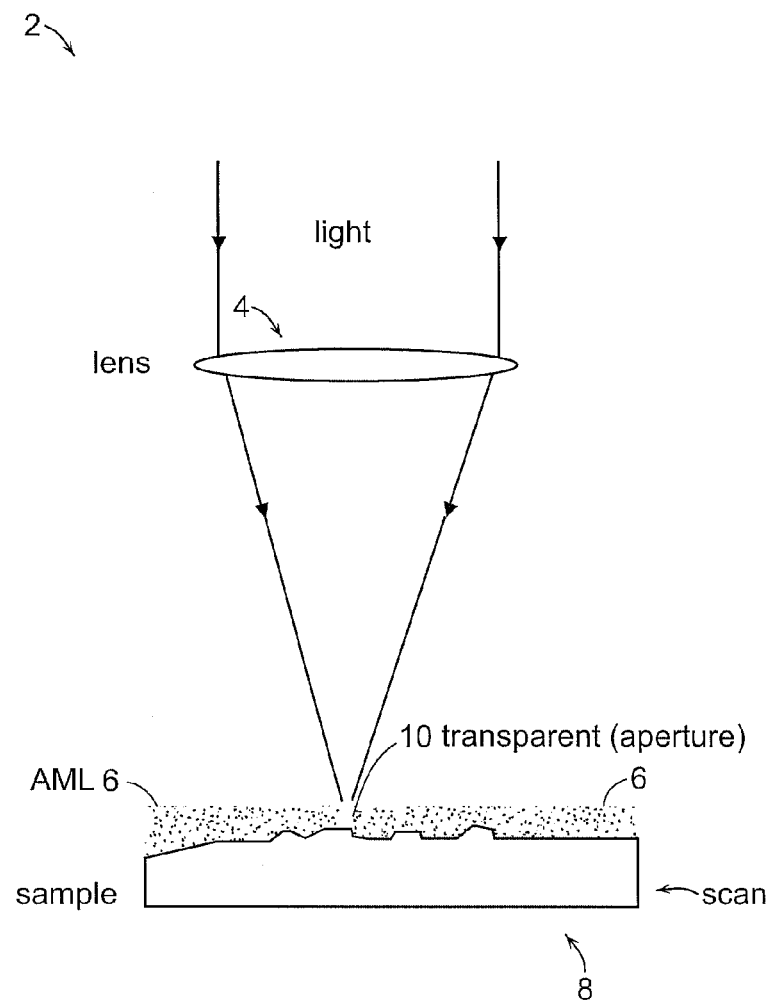
FIG. 3 is a schematic diagram illustrating absorbance modulation with a single wavelength in a conventional microscope.

FIG. 3 shows the schematic of a microscope 2 that uses the absorbance-modulation layer (AML) 6. The sample 8 is first coated with the AML 6. A lens structure 4, such as microlens, zone plate, or other similar structure can also be used, focuses normally incident light onto the AML 6, creating a transparent aperture 10. The size of the aperture 10 is controlled by the intensity of the illumination, and can be made smaller than the wavelength. This aperture 10 in the AML 6 illuminates the sample 8 with evanescent near field. The reflected light from the sample 8 may be collected by the lens structure 4 itself and imaged. In this case, a confocal technique is also possible. If the sample is transparent, a detector placed behind the sample may be used to collect the transmitted light. Once the signal is collected, the light is turned off, which closes the aperture. The sample (or the lens) is stepped and the process is repeated. The image of the sample is thus built-up from several sub-diffraction-limited signal values.

Figure 4:
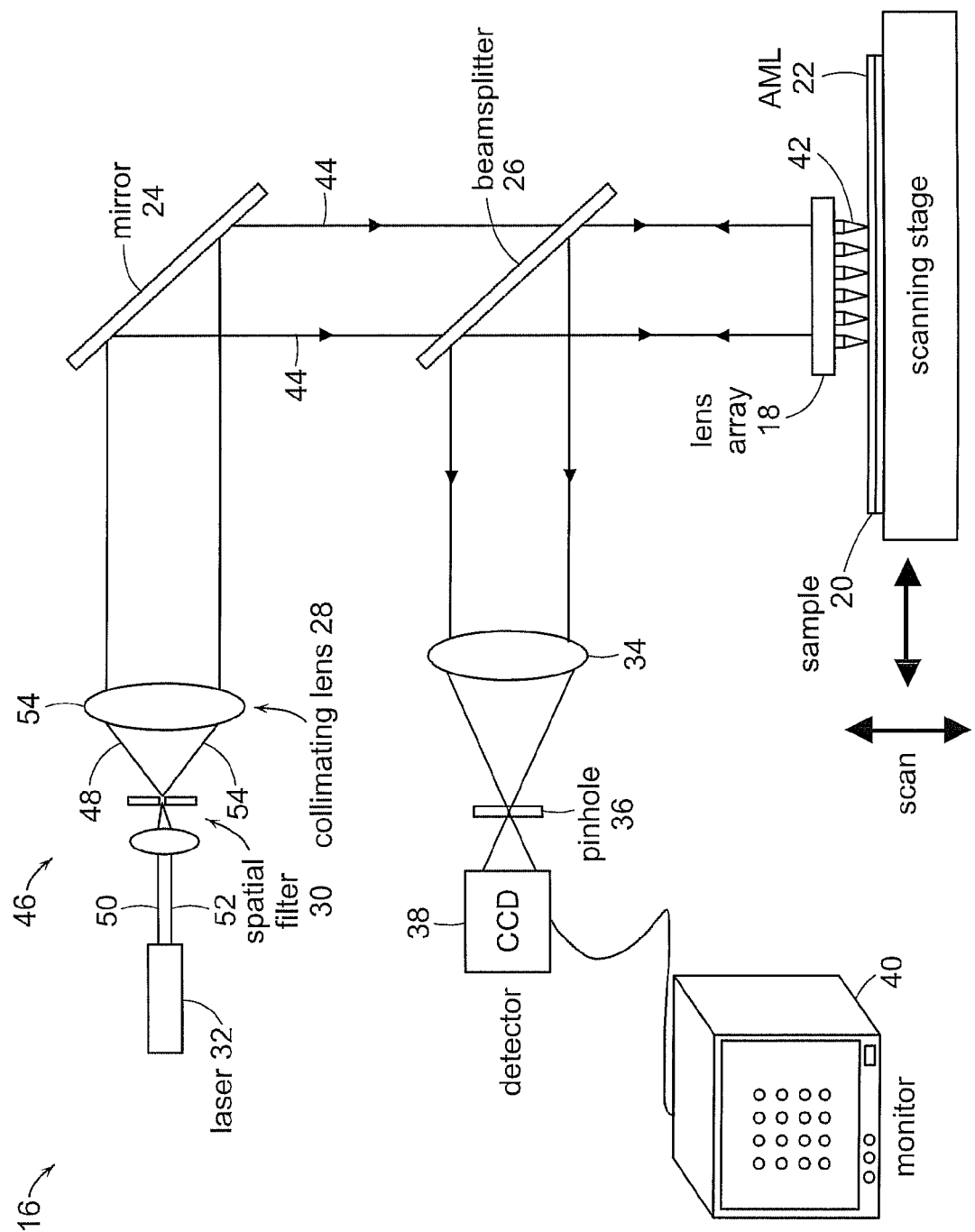
FIG. 4 is a schematic diagram illustrating parallelizing the technique for high throughput microscopy using an array of lenses and an AML

FIG. 4 is a schematic diagram illustrating a parallel imaging system 16 using a confocal technique and an array of lenses structure 18. By using an array of lenses 18 (microlenses or zone plates) or a diffractive-optical element, an array of tightly focused spots or apertures 42 can be created on the surface of the AML 22. The array of lenses 18 uses light sources 44 received by a mirror 24 for producing and illuminating the spots 42 on the sample 20. The light source 44 is produced by a laser providing light signal 50, 52 to a spatial filter 30 for filtering. The spatial filter 30 includes a lens 46 and a pinhole 48 and outputs two light signals 54 that are provided to a collimating lens 28. The collimating lens provides as outputs the light sources 44.

By scanning the sample 20 or the array of spots or apertures 42, the imaging process described above can be made highly parallel. A beamsplitter 26 collects the reflected light from the array of lenses 18 that provides the reflected light to a collimating lens 34. The collimating lens 34 focuses the reflected light thru a pinhole 36 and that is eventually collected by a CCD detector 38. The CCD detector 38 processes the reflected light and outputs a graphical representation of the properties of the reflected to a computer system 40. An array of zone plates for lithography as well as scanning confocal microscopy can be used.

Figure 5B:
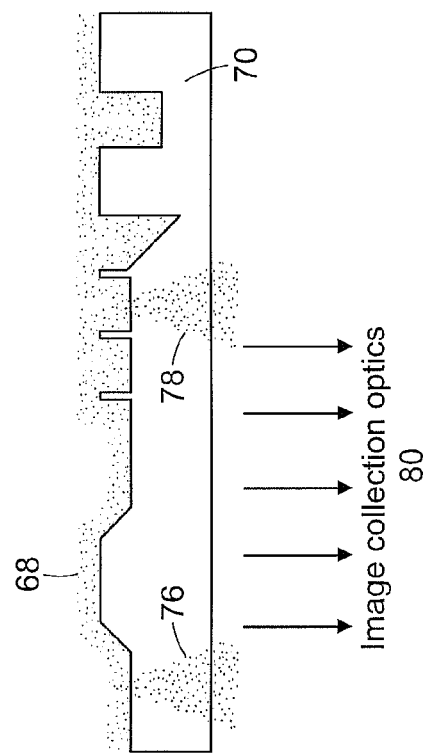
FIGS. 5A-5B are schematic diagrams illustrating transmission-mode absorbance modulation microscopy based on a two-wavelength absorbance modulation.
Figure 5A:
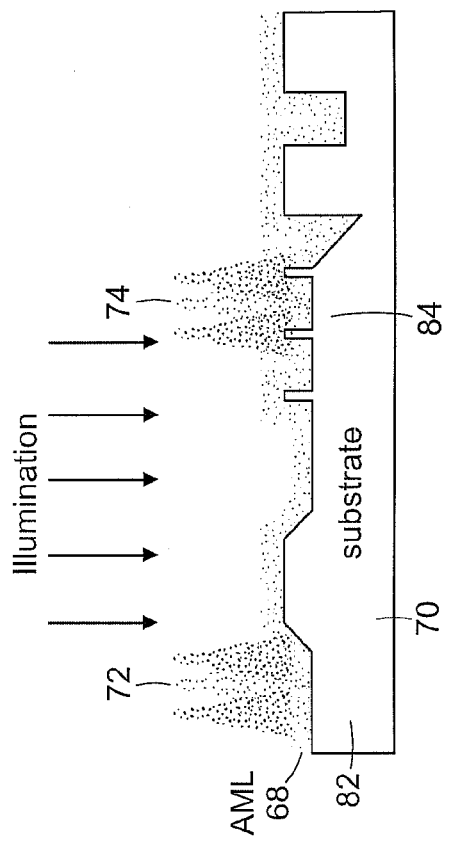

A photochromic absorbance-modulation layer, if illuminated by a focused spot at one wavelength, $\lambda_1$ and a ring-shaped spot at another wavelength, $\lambda_2$, results in a deep-sub-wavelength aperture as described earlier. In this situation, even higher resolution is achievable and the system may be used in transmission mode FIGS. 5A-5B or in reflection mode FIGS. 6A-6B. In FIG. 5A, the substrate 70 can be transparent to $\lambda_1$ and $\lambda_2$. The AML 68 includes apertures 82, 84 corresponding to the focused spot at one wavelength, $\lambda_1$ and the ring-shaped spot at another wavelength, $\lambda_2$. Once the apertures 82, 84 are exposed to illumination, evanescent near fields 72, 74 are produced having wavelengths to $\lambda_1$ and $\lambda_2$. FIG. 5B shows the reflected light signals 76 and 78 associated with the evanescent near fields 72, 74 being collected by and image collection optics 80 such as an array of lenses or zone plates for processing. The substrate 70 is scanned relative to the exposure to build up the final image. The exposure may be generated by a large variety of means including an array of diffractive optics.

Figure 6B:
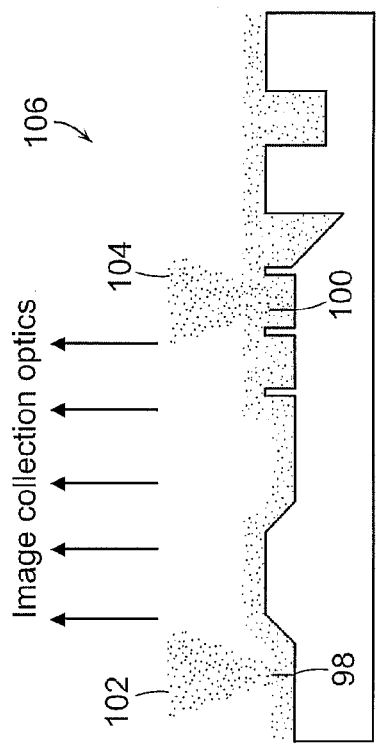
FIGS. 6A-6B are schematic diagrams illustrating reflection-mode absorbance modulation microscopy based on a two-wavelength absorbance modulation.
Figure 6A:
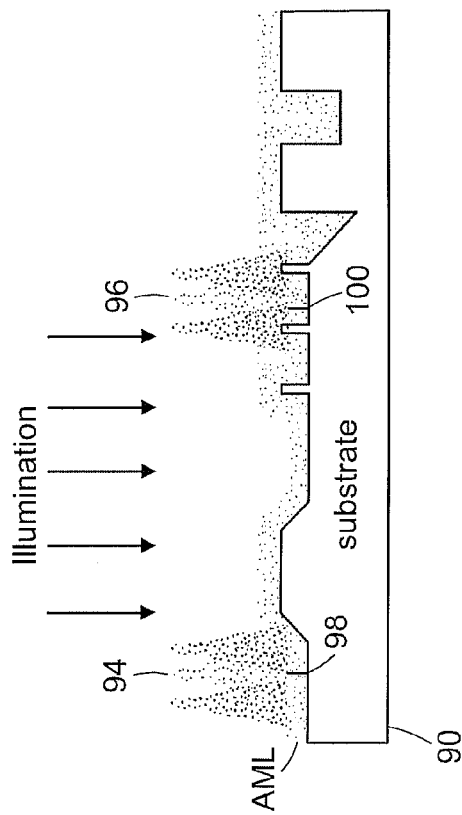

FIG. 6A show a substrate 90 can be transparent to $\lambda_1$ and $\lambda_2$. The AML 92 includes apertures 98, 100 corresponding to the focused spot at one wavelength, $\lambda_1$ and the ring-shaped spot at another wavelength, $\lambda_2$. Once the apertures 98, 100 are exposed to illumination, evanescent near fields 94, 96 are produced having wavelengths to $\lambda_1$ and $\lambda_2$. FIG. 6B shows the reflected light signals 102 and 104 associated with the evanescent near fields 94, 96 being collected by and image collection optics 106 such as an array of lenses or zone plates for processing. The substrate 70 is scanned relative to the exposure to build up the final image. The exposure may be generated by a large variety of means including an array of diffractive optics.

In both cases, a confocal arrangement may be used to perform 3-D imaging. The substrate is scanned relative to the exposure to build up the final image. The exposure may be generated by a large variety of means including an array of diffractive optics.

Figure 7A:
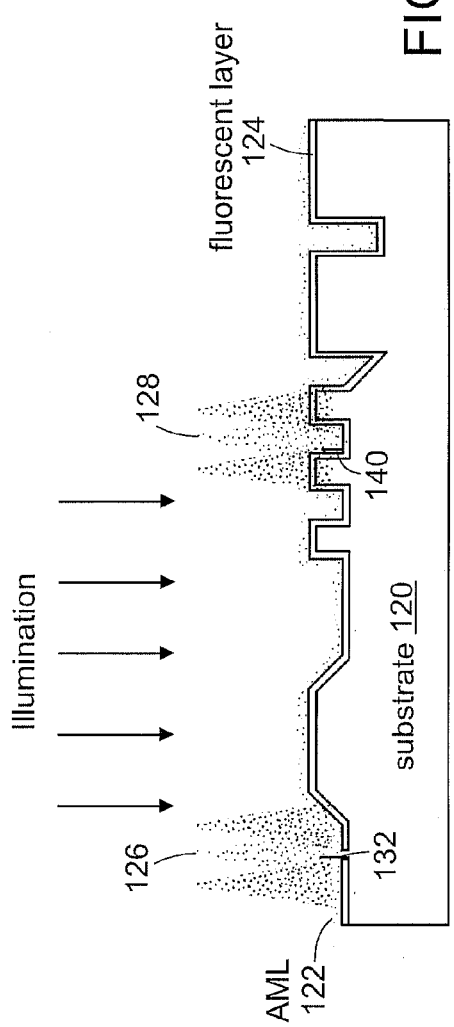
FIGS. 7A-7C are schematic diagrams illustrating fluorescence signal generation and detection in an absorbance-modulation microscopy.
Figure 7B:
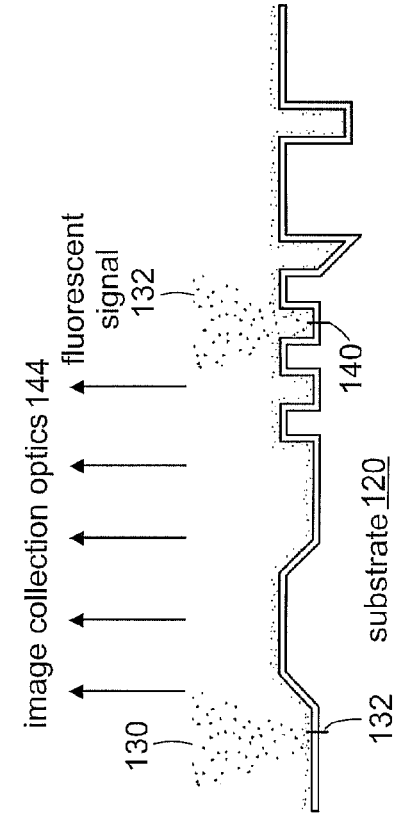
Figure 7C:
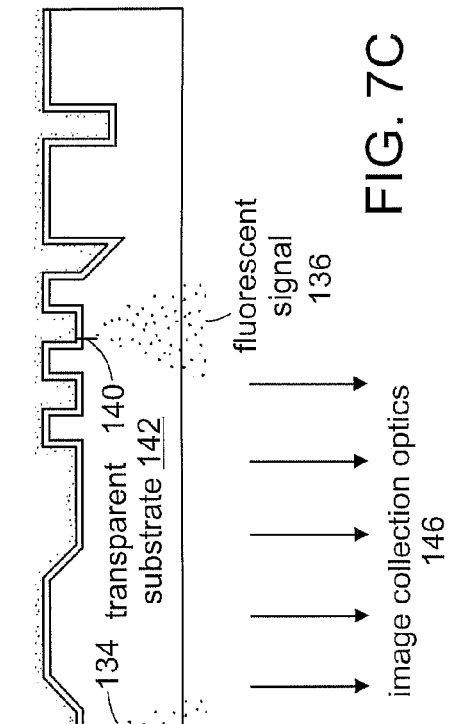

The near-fields generated via absorbance modulation can excite fluorescence as illustrated in FIG. 7A-7C, which can then be detected with far-field optics. FIG. 7A show a substrate 120 can be transparent to $\lambda_1$ and $\lambda_2$. The AML 122 includes apertures 138, 140 corresponding to the focused spot at one wavelength, $\lambda_1$ and the ring-shaped spot at another wavelength, $\lambda_2$. The apertures 138, 140 expose portion of a fluorescent layer 124. Once the apertures 138, 140 are exposed to illumination, evanescent near fields 126, 128 are produced having wavelengths to $\lambda_1$ and $\lambda_2$ associated with the exposed fluorescent layer 124. FIG. 7B shows the reflected light signals 130 and 132 associated with the evanescent near fields 126, 128 being collected by and image collection optics 144 such as an array of lenses or zone plates for processing. The substrate 120 is scanned relative to the exposure to build up the final image. In the FIG. 7C, the substrate 142 can be transparent to $\lambda_1$ and $\lambda_2$. The reflected light signals 134 and 136 associated with the evanescent near fields 126, 128 being collected by and image collection optics 146 such as an array of lenses or zone plates for processing. The substrate 142 is scanned relative to the exposure to build up the final image. The exposure can be generated by a large variety of means including an array of diffractive optics.

In general, any signal can be used; the clear advantage being the increase in spatial resolution arising from the generated near-fields.

Figure 8:
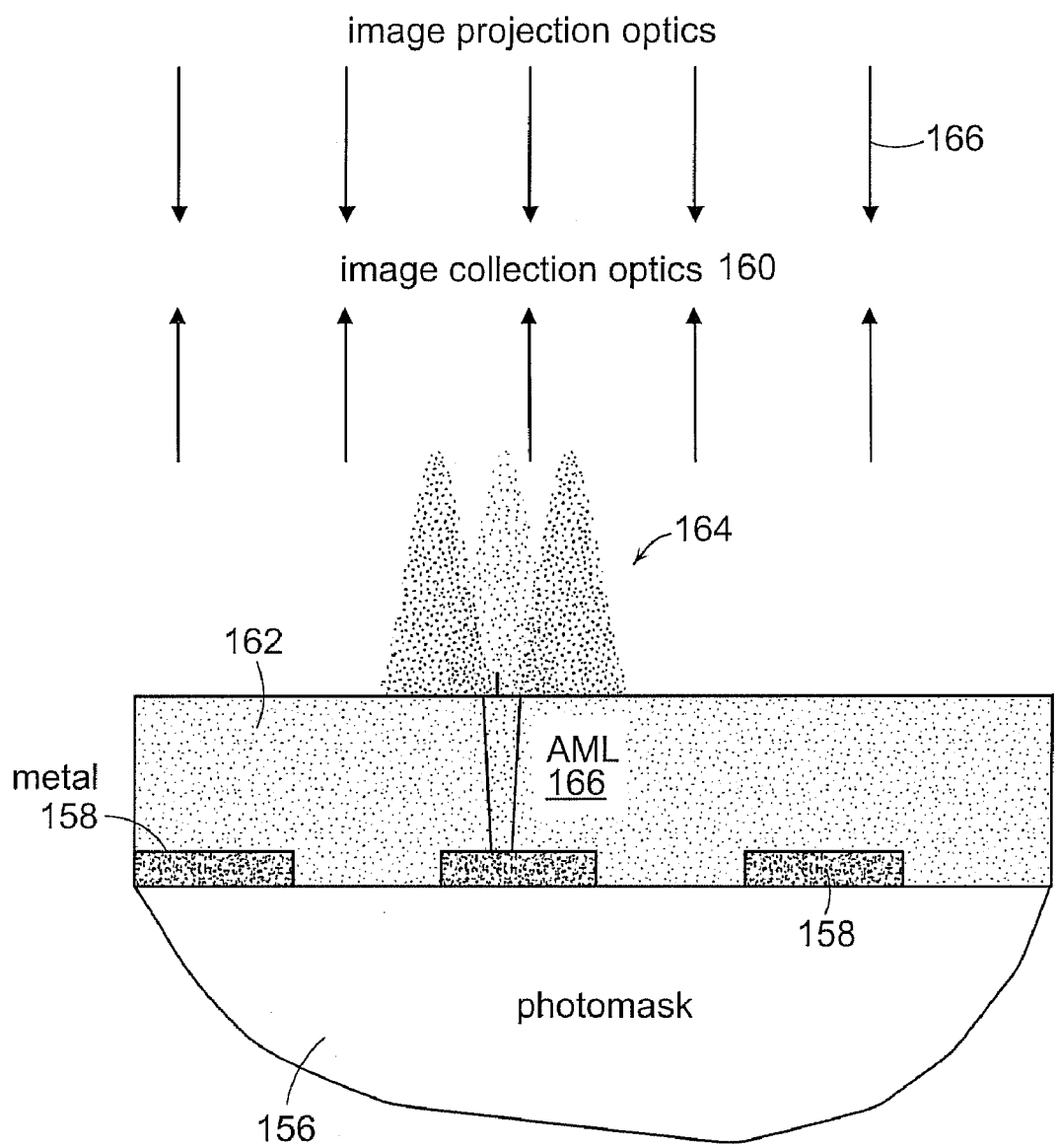
FIG. 8 is a schematic diagram illustrating imaging a binary photomask using absorbance modulation.

FIG. 8 shows A binary photomask 156 (chrome on glass) being imaged at high resolution using absorbance modulation. In the simplest case, one can assume that the thickness of the photomask 156 is negligible compared to the thickness of the AML 162. In this case, the AML 162 is deposited either directly on top of the mask or on top of a thin protective barrier layer 158 comprising a metal, which lies on top of the mask. When the two wavelengths are now focused onto the AML as shown in FIG. 8, a sub-wavelength aperture 166 is opened in the AML 162, and using light from an image projection optics 166 at $\lambda_1$ illuminates a sub-wavelength region of the mask. 156. Since the AML 162 includes chrome and is highly reflective, the reflected signal 164 can be collected using an image collection optics 160, such as a lens structure, to map out the lateral geometries in the photomask 156. Since the photomask is transparent, the transmitted light may be collected to create the complimentary image. A filter may be used to select $\lambda_1$ before the collection optics 160.

Figure 9:
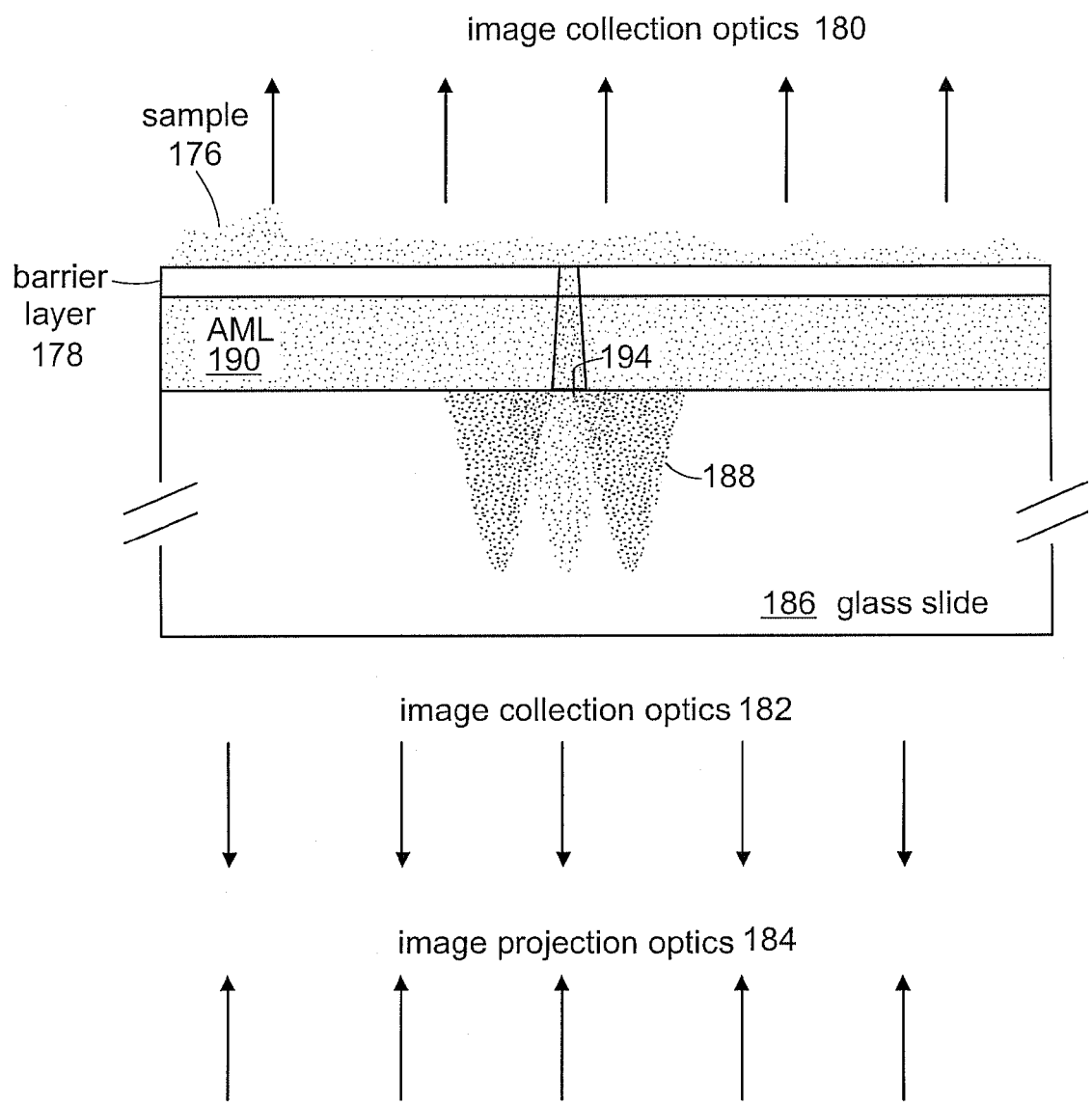
FIG. 9 is a schematic diagram illustrating imaging samples on a glass slide using absorbance modulation

FIG. 9 show a sample 176 being used in a conventional microscopy is placed on a glass slide 186. One can use absorbance modulation to increase lateral resolution in this case as well. The AML 190 is spun on top of the glass slide 186 as shown. A thin protective layer 178 can be spun on top of the AML 190 to avoid the sample contacting the AML 190. The sample 176 to be imaged is then placed on top of the protective layer 178. In the case of biological samples, it can be possible to grow the sample 176 directly on this layer 178 with the appropriate choice of material for this layer 178. In this case, the AML 190 is illuminated thru an aperture 194 from below using an image projection optics 184, such as a laser. The reflected signal produced by near-field 188 can be collected either from above (in transmission) using image collection optics 180 or below (in reflection) using image collection optics 182.

Figure 10:
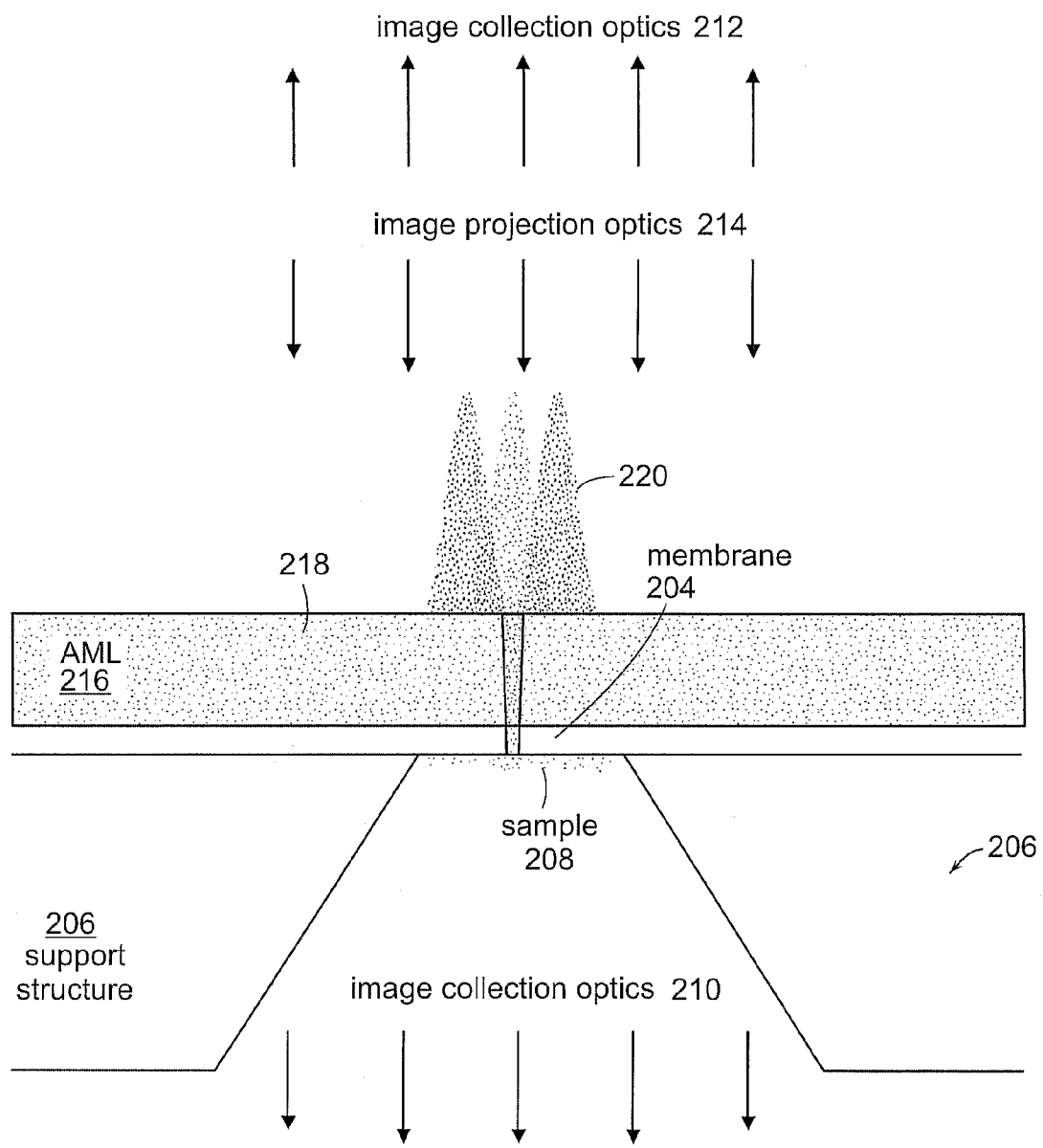
FIG. 10 is a schematic diagram illustrating imaging through a membrane using absorbance modulation.

Imaging can also be done on top of a thin membrane 204 instead of a glass slide, as shown in FIG. 10. This has the advantage that the working distance of the projection optics can be smaller than in the case of the glass slide. The AML 216 is spun on top of the member 204 as shown. The sample 208 to be imaged is then placed on bottom side of the membrane 204. An aperture 218 formed on the AML 216 is illuminated from above using an image projection optics 214, such as a laser. The reflected signal produced by near-field 220 can be collected either from above (in transmission) using image collection optics 212 or below (in reflection) using image collection optics 210. A confocal mode can be implemented to improve the signal to noise ratio. This is especially useful when working with high-numerical-aperture diffractive-optical arrays, which are essential for massive parallelization of this technique.

The thicknesses of the AML 6, 22, 68, 92, 122, 162 216 described herein can be anywhere from 10 nm to 1000 nm. The size of the apertures 10, 42, 82, 84, 98, 100, 138, 140, 166, 194, 218 described herein that is formed via the process of absorbance modulation is sub-wavelength, so its diameter typically ranges from 1 nm to 200 nm.

Figure 11:
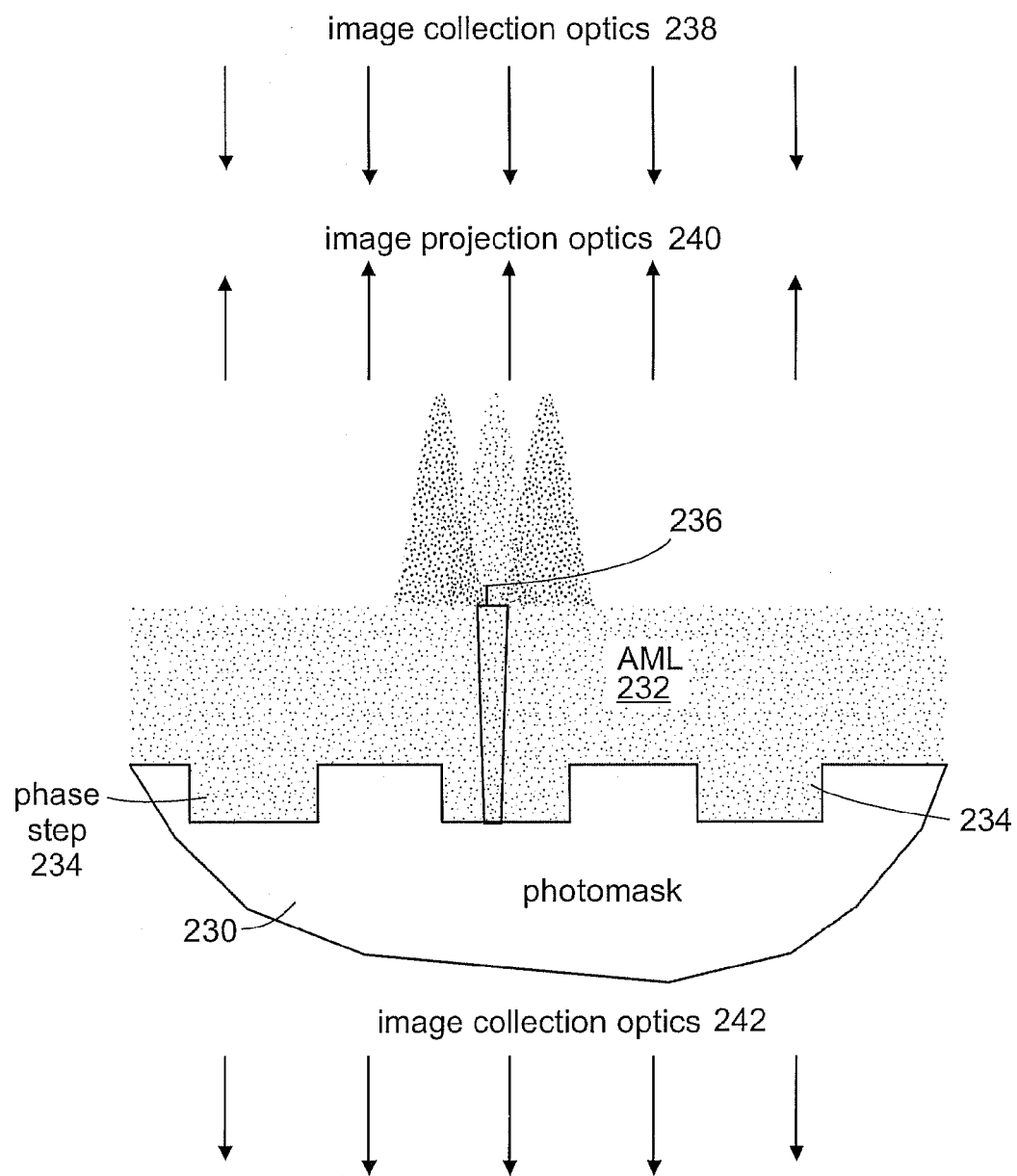
FIG. 11 is a schematic diagram illustrating imaging a phase shift mask using absorbance modulation.

A phase shift mask is more difficult to image because of the considerable topography involved. FIG. 11 shows a the possibility of imaging a phase shift mask by conformally coating the mask with a thick layer of AML using a plurality of phase steps 234. Typically the thickness of the phase step can be anywhere from 50 nm to 1000 nm. The corresponding thickness of the AML has to be approximately twice that of the phase step for conformal coating. When this thick layer 232 is illuminated it produces near-fields 236, using an image projection optics such as a laser, thru an aperture 236 formed on the AML 232 with the two wavelengths, the size as well as the intensity of the transmitted light will vary with the thickness of the AML 232 it encounters. By characterizing the material properties of the AML 232, it is possible to extract the thickness information with high precision from the collected signal either in reflection or in transmission using image collection optics 240, 242, while still maintaining high lateral resolution.

Essentially, the invention provides a novel technique using a separate layer that is called the absorbance modulation layer (AML) is used that is physically separate from the sample. No chemical modification of the sample is necessary. A sub-wavelength aperture is generated within the AML, whose size is determined by the material properties of the AML and the intensities of the illuminating wavelengths. The light that transmits through this aperture essentially generates optical near-fields that can then probe the sample in a very general fashion. For example, the near-field can excite fluorescence or scatter of a sample, or the like. The material parameters of the AML are responsible for breaking the diffraction limit. This is irrespective of the sample that is being imaged. This, therefore, separates the probe from the excitation and signal generation process. This provides additional design degrees of freedom in the choice of the nature of the excitation and the detection processes.

Although the present invention has been shown and described with respect to several preferred embodiments thereof, various changes, omissions and additions to the form and detail thereof, may be made therein, without departing from the spirit and scope of the invention.

What is claimed is:

1. An imaging system comprising:
   a sample to be scanned by said imaging system;
   an absorbance modulation layer (AML) positioned in close proximity to said sample and is physically separate from the sample;
   one or more sub-wavelength apertures being generated within the AML, whose size is determined by the material properties of the AML and the intensities of the illuminating wavelengths, by illuminating the AML layer with a tightly focused beam a transparent region in the AML layer is created where the transparent region serves as the one or more sub-wavelength apertures allowing only evanescent fields to push through to the other side of the AML; and
   a light source that transmits an optical signal through said one or more sub-wavelength apertures generating optical near-fields that are collected for imaging.

2. The imaging system of claim 1, wherein said one or more sub-wavelength apertures is generated using a lens structure that focuses normally incident light onto the AML.

3. The imaging system of claim 1, wherein said one or more sub-wavelength apertures is generated using an array of lens structures that focuses normally incident light onto the AML to form a plurality of sub-wavelength apertures.

4. The imaging system of claim 1, wherein said light source comprise a laser.

5. The imaging system of claim 1, wherein said AML is positioned on a reflective or transparent substrate.

6. The imaging system of claim 1, wherein said AML is positioned for imaging a phase shift mask.

7. The imaging system of claim 1, wherein said AML is positioned for imaging a sample on a glass slide.

8. The imaging system of claim 1, wherein said AML is positioned for imaging through a membrane.

9. A method of forming an imaging system comprising:
   providing a sample to be scanned by said imaging system;
   forming an absorbance modulation layer (AML) positioned in close proximity to said sample and is physically separate from the sample;
   forming one or more sub-wavelength apertures within the AML, whose size is determined by the material properties of the AML and the intensities of the illuminating wavelengths, by illuminating the AML layer with a tightly focused beam a transparent region in the AML layer is created where the transparent region serves as the one or more sub-wavelength apertures allowing only evanescent fields to push through to the other side of the AML; and providing a light source that transmits an optical signal through said one or more sub-wavelength apertures generating optical near-fields that are collected for imaging.

10. The method of claim 9, wherein said one or more sub-wavelength apertures is generated using a lens structure that focuses normally incident light onto the AML.

11. The method of claim 9, wherein said one or more sub-wavelength apertures is generated using an array of lens structures that focuses normally incident light onto the AML to form a plurality of sub-wavelength apertures.

12. The method of claim 9, wherein said light source comprise a laser.

13. The method of claim 9, wherein said AML is positioned on a reflective or transparent substrate.

14. The method of claim 9, wherein said AML is positioned for imaging a phase shift mask.

15. The method of claim 9, wherein said AML is positioned for imaging a sample on a glass slide.

16. The method of claim 9, wherein said AML is positioned for imaging through a membrane.

17. A method of performing the operations of an imaging system comprising:

scanning a sample by said imaging system;

positioning an absorbance modulation layer (AML) in close proximity to said sample and is physically separate from the sample;

generating one or more sub-wavelength apertures within the AML, whose size is determined by the material properties of the AML and the intensities of the illuminating wavelengths, by illuminating the AML layer with a tightly focused beam a transparent region in the AML layer is created where the transparent region serves as the one or more sub-wavelength apertures allowing only evanescent fields to push through to the other side of the AML; and transmitting an optical signal through said one or more sub-wavelength apertures generating optical near-fields that are collected for imaging.

18. The method of claim 17, wherein said generating of said one or more sub-wavelength apertures comprises a step of using a lens structure that focuses normally incident light onto the AML.

19. The method of claim 17, wherein said generating one or more sub-wavelength apertures further comprises a step of using an array of lens structures that focuses normally incident light onto the AML to form a plurality of sub-wavelength apertures.

20. The method of claim 17, wherein said transmitting an optical signal through said one or more sub-wavelength apertures further comprises a step of using a laser.

21. The method of claim 17, wherein said positioning AML in close proximity to said sample further comprises a step of positioning said AML on a reflective or transparent substrate.

22. The method of claim 17, wherein said positioning AML in close proximity to said sample further comprises a step of positioning said AML for imaging a phase shift mask.

23. The method of claim 17, wherein said positioning AML in close proximity to said sample further comprises a step of positioning said AML for imaging a sample on a glass slide.

24. The method of claim 17, wherein said positioning AML in close proximity to said sample further comprises a step of positioning said AML for imaging through a membrane.

* * * * *